United States Patent
Takamori

(10) Patent No.: US 8,487,618 B2
(45) Date of Patent: Jul. 16, 2013

(54) HIGH FREQUENCY COIL UNIT AND MAGNETIC RESONANCE DIAGNOSTIC APPARATUS HAVING A SELF-CONTAINED COOLING AIRFLOW CHASSIS

(75) Inventor: Hiromitsu Takamori, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 640 days.

(21) Appl. No.: 12/626,044

(22) Filed: Nov. 25, 2009

(65) Prior Publication Data

US 2010/0134109 A1 Jun. 3, 2010

(30) Foreign Application Priority Data

Nov. 28, 2008 (JP) ................................. 2008-304643

(51) Int. Cl.
*G01R 33/3403* (2006.01)
*G01R 33/34* (2006.01)
*G01R 33/3804* (2006.01)

(52) U.S. Cl.
USPC ............................ 324/318; 324/309; 324/307

(58) Field of Classification Search
USPC ....... 324/300–32; 600/407–435; 382/128–131
See application file for complete search history.

(56) References Cited

U.S. PATENT DOCUMENTS

| | | | | |
|---|---|---|---|---|
| 5,489,848 A | * | 2/1996 | Furukawa | 324/318 |
| 5,786,695 A | * | 7/1998 | Amor et al. | 324/320 |
| 6,011,394 A | * | 1/2000 | Petropoulos et al. | 324/318 |
| 6,496,006 B1 | | 12/2002 | Vrijheid | 324/318 |
| 6,768,306 B2 | | 7/2004 | Morita et al. | 324/322 |
| 6,774,631 B2 | | 8/2004 | Heid | 324/318 |
| 6,867,592 B2 | | 3/2005 | Gebhardt et al. | 324/318 |
| 6,894,495 B2 | * | 5/2005 | Kan | 324/318 |
| 6,909,283 B2 | | 6/2005 | Emeric et al. | 324/300 |
| 6,967,482 B2 | | 11/2005 | Morita et al. | 324/318 |
| 6,975,118 B2 | | 12/2005 | Okada et al. | 324/318 |
| 6,992,483 B1 | | 1/2006 | Emeric et al. | 324/300 |

(Continued)

FOREIGN PATENT DOCUMENTS

| | | |
|---|---|---|
| JP | 08-322815 | 12/1996 |
| JP | 9-510 | 1/1997 |

(Continued)

OTHER PUBLICATIONS

U.S. Appl. No. 12/273,013, Ayumi Katsunuma, filed Nov. 18, 2008.

(Continued)

*Primary Examiner* — Melissa Koval
*Assistant Examiner* — Tiffany Fetzner
(74) *Attorney, Agent, or Firm* — Nixon & Vanderhye PC

(57) ABSTRACT

A radio frequency coil unit includes a chassis which has a tubiform inner cylinder, a plurality of flanges arranged apart from each other, each of the plurality of flanges provided in a state of protruding outwards from the inner cylinder while in contact with a whole outer circumference surface of the inner cylinder, and a tubiform external cylinder in which each of the plurality of flanges is provided in a state of contacting an inner surface thereof, wherein the chassis forms a flow path of cooling air as a space surrounded by the inner cylinder, the plurality of flanges and the external cylinder, and a radio frequency coil which is mounted on the inner cylinder or the external cylinder to be positioned in the space surrounded by the inner cylinder, the plurality flanges and the external cylinder.

15 Claims, 5 Drawing Sheets

U.S. PATENT DOCUMENTS

| | | | |
|---|---|---|---|
| 6,998,842 B2 | 2/2006 | Sinnema et al. | 324/318 |
| 7,015,692 B2 * | 3/2006 | Clarke et al. | 324/300 |
| 7,084,635 B2 | 8/2006 | Morita et al. | 324/322 |
| 7,141,979 B2 | 11/2006 | Marek | 324/322 |
| 7,154,270 B2 | 12/2006 | Arz et al. | 324/318 |
| 7,161,353 B2 | 1/2007 | Schaaf et al. | 324/318 |
| 7,301,343 B1 | 11/2007 | Sellers | 324/318 |
| 7,368,913 B2 | 5/2008 | Sellers | 324/318 |
| 7,382,124 B2 * | 6/2008 | Hattori et al. | 324/304 |
| 7,397,244 B2 * | 7/2008 | Cirel | 324/318 |
| 7,570,058 B1 | 8/2009 | Wong et al. | 324/318 |
| 7,576,542 B1 | 8/2009 | Lvovsky | 324/318 |
| 7,633,295 B2 * | 12/2009 | Tyszka et al. | 324/318 |
| 7,663,366 B2 | 2/2010 | Takamori | 324/318 |
| 7,701,216 B2 | 4/2010 | Du et al. | 324/318 |
| 7,759,935 B2 | 7/2010 | DeVries et al. | 324/318 |
| 7,868,617 B2 | 1/2011 | Seeber et al. | |
| 2001/0033168 A1 | 10/2001 | Heid | 324/322 |
| 2002/0073717 A1 | 6/2002 | Dean et al. | 324/318 |
| 2002/0135370 A1 * | 9/2002 | Kan | 324/318 |
| 2003/0206018 A1 | 11/2003 | Gebhardt et al. | 324/318 |
| 2004/0119472 A1 | 6/2004 | Laskaris et al. | 324/318 |
| 2005/0030028 A1 * | 2/2005 | Clarke et al. | 324/318 |
| 2005/0035764 A1 | 2/2005 | Mantone et al. | 324/318 |
| 2005/0168222 A1 | 8/2005 | Arz et al. | 324/318 |
| 2005/0179512 A1 | 8/2005 | Weyers et al. | 335/30 |
| 2006/0038567 A1 | 2/2006 | Morita et al. | 324/318 |
| 2006/0082370 A1 * | 4/2006 | Cirel | 324/318 |
| 2006/0263300 A1 * | 11/2006 | Hattori et al. | 424/9.3 |
| 2007/0016003 A1 | 1/2007 | Piron et al. | 600/415 |
| 2008/0001601 A1 | 1/2008 | Sellers et al. | 324/318 |
| 2008/0173026 A1 | 7/2008 | Mita et al. | 335/216 |
| 2008/0284430 A1 * | 11/2008 | Tyszka et al. | 324/307 |
| 2009/0128269 A1 | 5/2009 | Seeber et al. | 324/318 |
| 2009/0134874 A1 | 5/2009 | Katsunuma et al. | 324/318 |
| 2009/0174407 A1 | 7/2009 | Han et al. | 324/318 |
| 2009/0200905 A1 * | 8/2009 | Gore et al. | 312/400 |
| 2010/0134109 A1 * | 6/2010 | Takamori | 324/318 |
| 2010/0219347 A1 | 9/2010 | Schulz | 324/318 |
| 2011/0254551 A1 | 10/2011 | Leussler | |

FOREIGN PATENT DOCUMENTS

| | | |
|---|---|---|
| JP | H7-157482 | 1/1997 |
| JP | 11-244255 | 9/1999 |
| JP | 2004-33380 | 2/2004 |
| JP | 2009-142647 | 7/2009 |

OTHER PUBLICATIONS

Chinese Office Action mailed on May 3, 2012 in CN 200910246371.7 with English translation.
Chinese Search Report re JP Application No. H7-157482 dated Aug. 10, 2010.
IDS in U.S. Appl. No. 12/273,013, filed Nov. 18, 2008.
Office Action in U.S. Appl. No. 12/273,013 mailed Aug. 31, 2010.
Amendment and IDS in U.S. Appl. No. 12/273,013 filed Jan. 31, 2011.
Supplemental Amendment and IDS in U.S. Appl. No. 12/273,013 filed Feb. 8, 2011.
Final Office Action in U.S. Appl. No. 12/273,013 mailed May 17, 2011.
Amendment Under 37 C.F.R. §1.116 in U.S. Appl. No. 12/273,013 filed Sep. 16, 2011.
Advisory Action in U.S. Appl. No. 12/273,013 mailed Sep. 23, 2011.
RCE and Amendment in U.S. Appl. No. 12/273,013 filed Nov. 15, 2011.
Supplemental Amendment in U.S. Appl. No. 12/273,013 filed Sep. 13, 2012.
Notice of Allowance in U.S. Appl. No. 12/273,013 mailed Oct. 4, 2012.

* cited by examiner

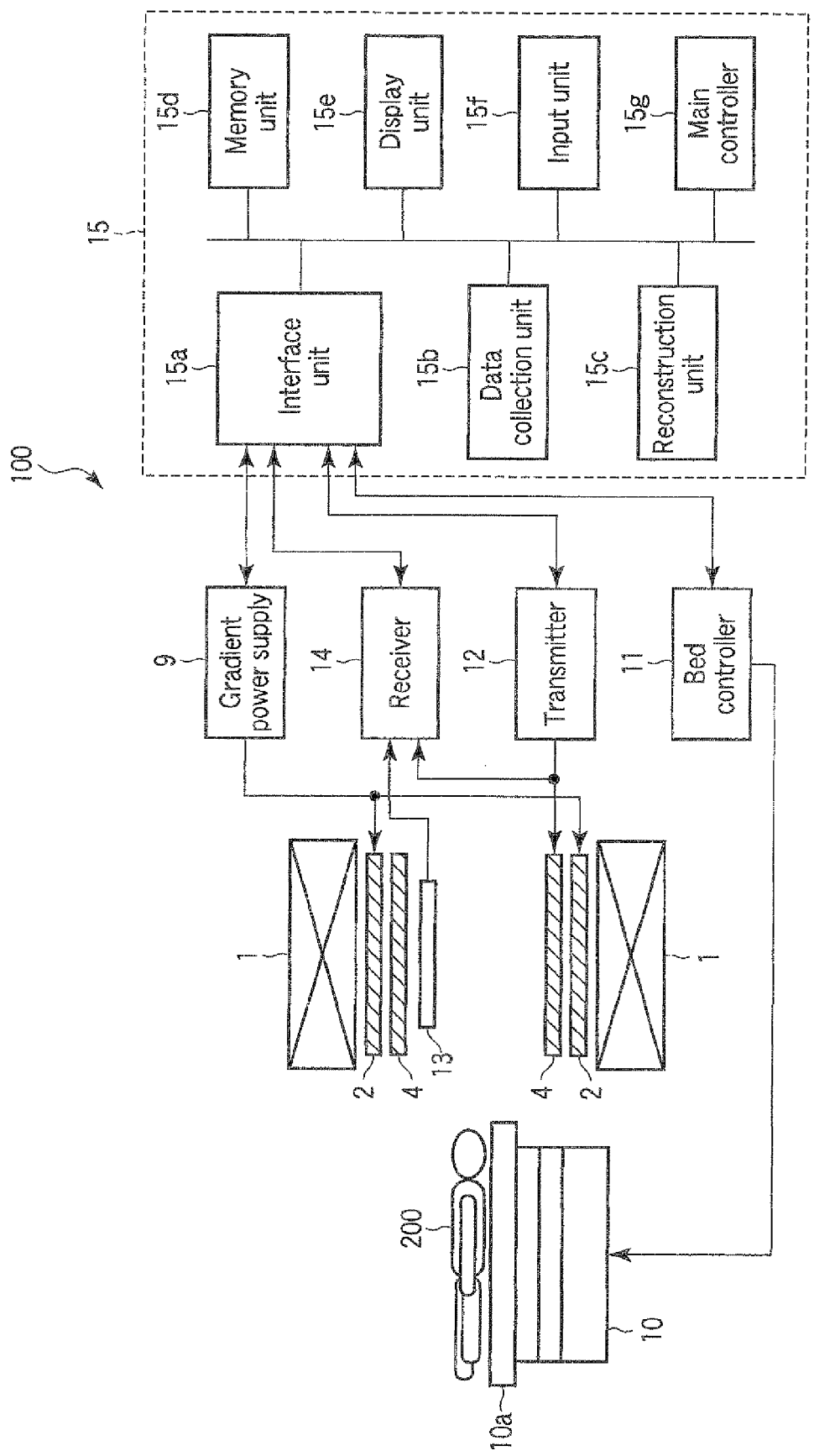
F I G. 1

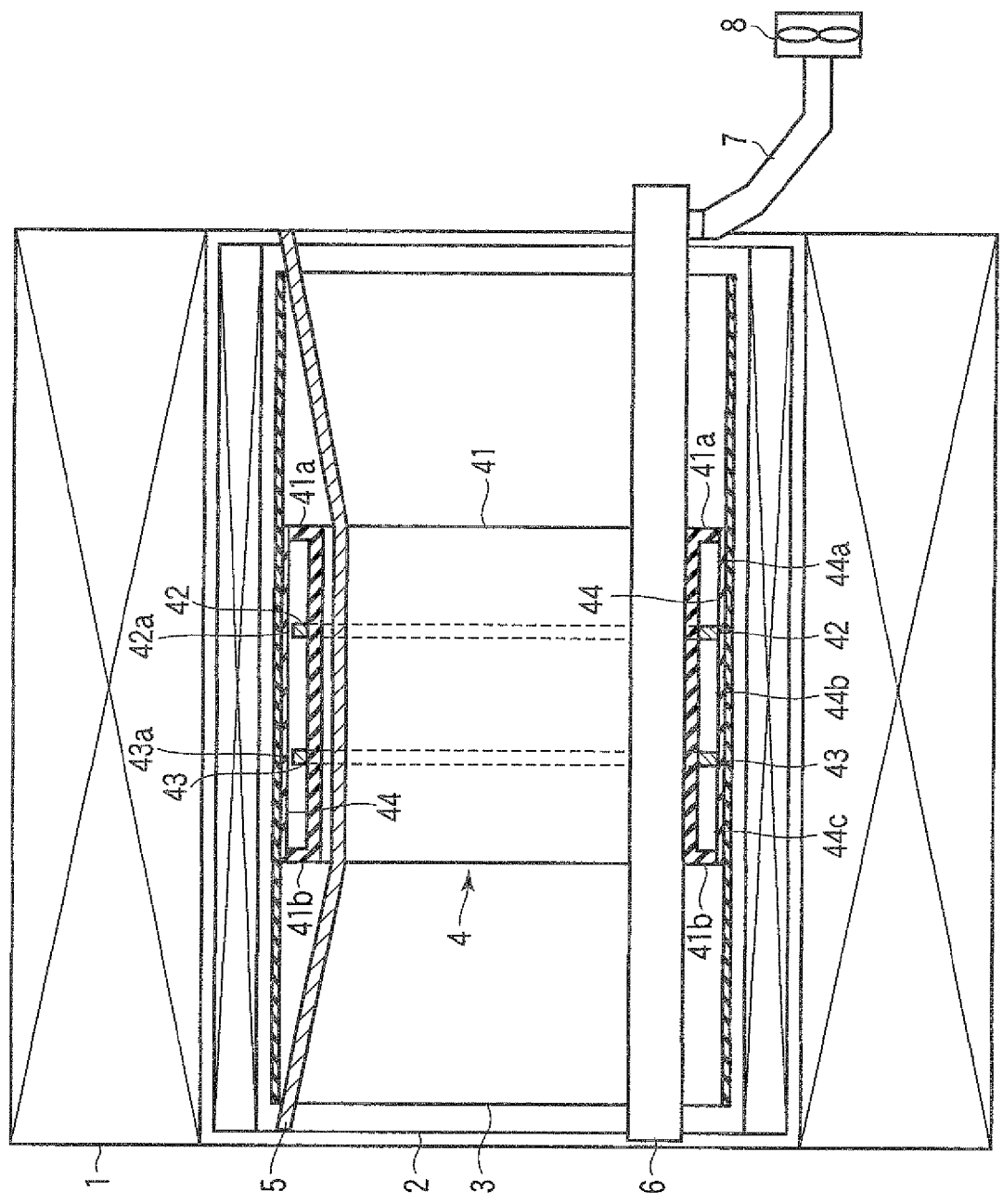
F I G. 2

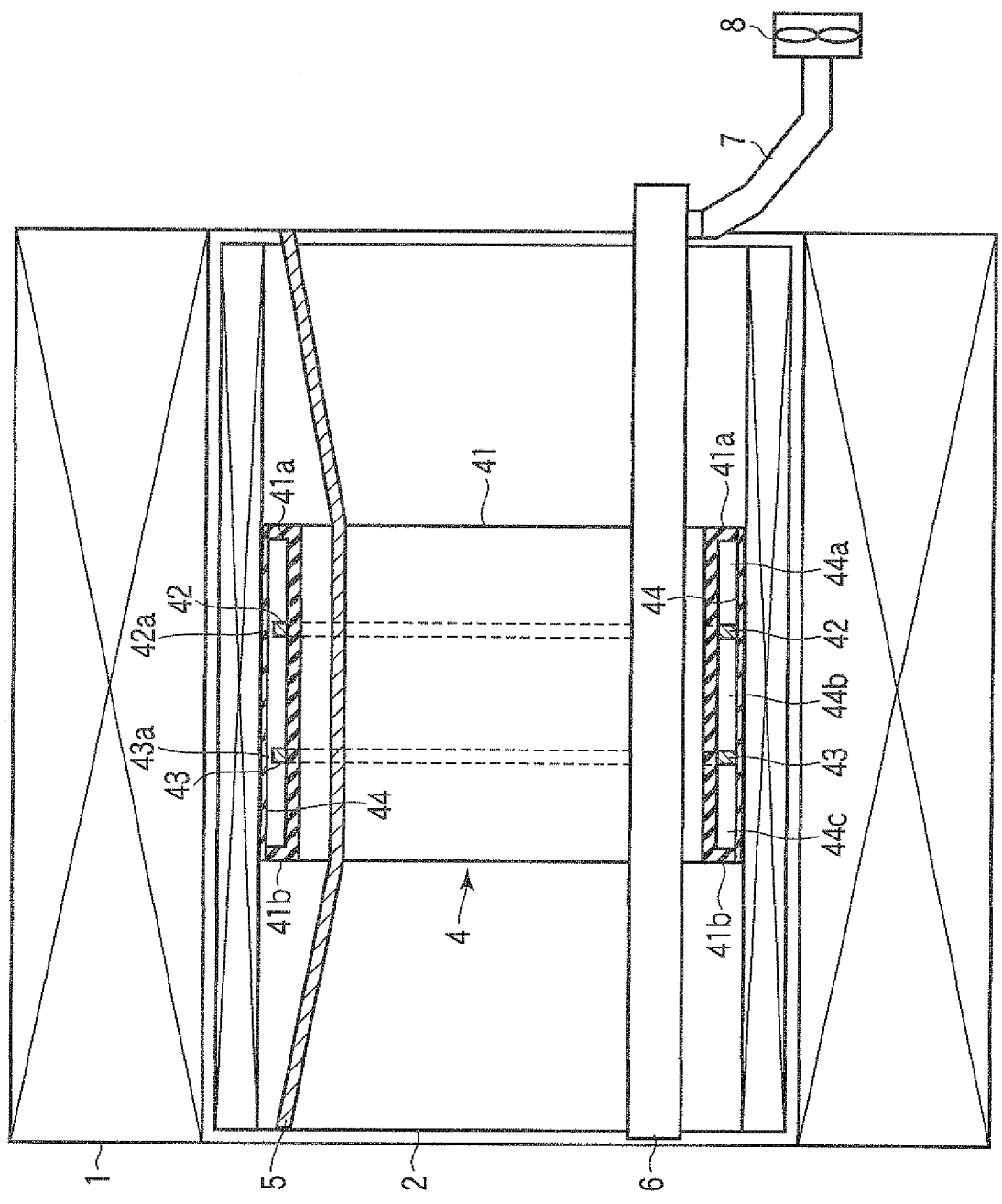
F I G. 5

HIGH FREQUENCY COIL UNIT AND MAGNETIC RESONANCE DIAGNOSTIC APPARATUS HAVING A SELF-CONTAINED COOLING AIRFLOW CHASSIS

CROSS-REFERENCE TO RELATED APPLICATIONS

This application is based upon and claims the benefit of priority from prior Japanese Patent Application No. 2008-304643, filed Nov. 28, 2008, the entire contents of which are incorporated herein by reference.

BACKGROUND OF THE INVENTION

1. Field of the Invention

The present invention is related to a magnetic resonance diagnostic apparatus which has a radio frequency coil arranged in a gantry, and a radio frequency coil unit used for this magnetic resonance diagnostic apparatus.

2. Description of the Related Art

In a magnetic resonance diagnostic apparatus, generally, a radio frequency coil (referred to hereinafter as an RF coil) such as a whole body coil (referred to hereinafter as a WB coil) is arranged inside a gantry.

The RF coil generates heat by energization. Conventionally, the RF coil was cooled by natural convection of the surrounding. Therefore, generally, no special cooling treatment was applied.

Therefore, there was a problem that heat generated by the RF coil increased the temperature of the imaging space inside the gantry and made the subject placed in this imaging space uncomfortable.

In order to deal with this, a cover has been discussed on being arranged leaving a certain space from the RF coil, to prevent heat generated by the RF coil from being transferred to the imaging space. However, in this case, there was a problem that the cover made the imaging space small and may give the subject an oppressive feeling.

Further, a structure to cool the RF coil by using cooling water is suggested in, for example, Jpn. Pat. Appln. KOKAI Publication No. 11-244255. However, according to the structure known by the reference, the structure of the cooling unit would become elaborate, and the accommodating space thereof would become large. Therefore, there has been a problem that the reduced imaging space may give the subject an oppressive feeling.

Under such circumstances, the applicant of the present invention suggests in Jpn. Pat. Appln. KOKAI Publication No. 2009-142647 a structure in which a space is formed between a member holding the RF coil (hereinafter referred to as a base portion) and a cover to generate a flow of cooling air in this space, in order to air-cool the RF coil.

However, sometimes the RF coil is removed from the gantry for maintenance. Therefore, the RF coil is desired to be taken out easily from the gantry. Accordingly, in the invention, an RF coil unit which is independent from the gantry is formed by the RF coil and the base portion holding the RF coil. The RF coil unit is not fixed to the gantry but is used in a state of being fitted in the imaging space. Further, when attaching or detaching the RF coil unit to or from the gantry, the RF coil unit is taken in and out from the imaging space from the opening of the imaging space of the gantry. Therefore, the outer diameter of the RF coil unit should be smaller than the inner diameter of the imaging space. Attachment/detachment of the RF coil unit would become easier as the difference between the outer diameter of the RF coil unit and the inner diameter of the imaging space increases. However, at the same time, as the difference between the outer diameter of the RF coil unit and the inner diameter of the imaging space increases, the base portion becomes less close to the wall surface forming the imaging space. Therefore, the structure suggested by Jpn. Pat. Appln. KOKAI Publication No. 2009-142647 is defective in that, since the cooling air would flow out of the imaging space, cooling efficiency of the RF coil would deteriorate.

It is considered that by mounting a seal member having resiliency on a position where the base portion is adjacent to the cover, air-tightness formed between the RF coil unit and the cover can be secured to a certain extent while enabling attachment/detachment of the RF coil unit with respect to the gantry. However, it would still be difficult to attach or detach the RF coil unit to or from the gantry as the above mentioned tightness improves.

BRIEF SUMMARY OF THE INVENTION

From the above mentioned circumstances, it has been desired to facilitate attachment/detachment of the RF coil unit with respect to the gantry while achieving air-tightness of the space formed between the RF coil unit and the cover.

According to a first aspect of the present invention, there is provided a radio frequency coil unit which is used by being arranged in a magnetic field formed by superimposing a gradient field on a static field in a gantry, wherein the gantry comprises a static field magnet unit which generates the static field, a gradient coil unit which generates the gradient field, and airflow generating unit which causes a flow of cooling air, the radio frequency coil unit comprising: a chassis which has a tubiform inner cylinder, a plurality of flanges arranged apart from each other, each of the plurality of flanges provided in a state of protruding outwards from the inner cylinder while in contact with a whole outer circumference surface of the inner cylinder, and a tubiform external cylinder in which each of the plurality of flanges is provided in a state of contacting an inner surface thereof, wherein the chassis forms a flow path of the cooling air as a space surrounded by the inner cylinder, the plurality of flanges and the external cylinder; and a radio frequency coil which is mounted on the inner cylinder or the external cylinder to be positioned in the space surrounded by the inner cylinder, the plurality of flanges and the external cylinder.

According to a second aspect of the present invention, there is provided a magnetic resonance diagnostic apparatus comprising: a static field magnet unit which generates a static field; a gradient coil unit which generates a gradient field to be superimposed on the static field; an airflow generating means which cause flow of cooling air; and a radio frequency, wherein the radio frequency coil unit comprises: a chassis which has a tubiform inner cylinder, a plurality of flanges arranged apart from each other and provided in a state of protruding outwards from the inner cylinder while in contact with a whole outer circumference surface of the inner cylinder, and a tubiform external cylinder in which each of the plurality of flanges is provided in a state of contacting the inner surface thereof, wherein the chassis forms a flow path of the cooling air as the space surrounded by the inner cylinder, the plurality of flanges and the external cylinder; and a radio frequency coil mounted on the inner cylinder or the external cylinder to be positioned in a space surrounded by the inner cylinder the plurality of flanges and the external cylinder.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 1 shows a configuration of a magnetic resonance diagnostic apparatus according to a first embodiment.

FIG. 2 is a partially cutaway view of a gantry structure of the magnetic resonance diagnostic apparatus according to the first embodiment.

FIG. 5 is a partially cutaway view of a structure of a gantry in a magnetic resonance diagnostic apparatus according to a third embodiment.

DETAILED DESCRIPTION OF THE INVENTION

Figure 3:
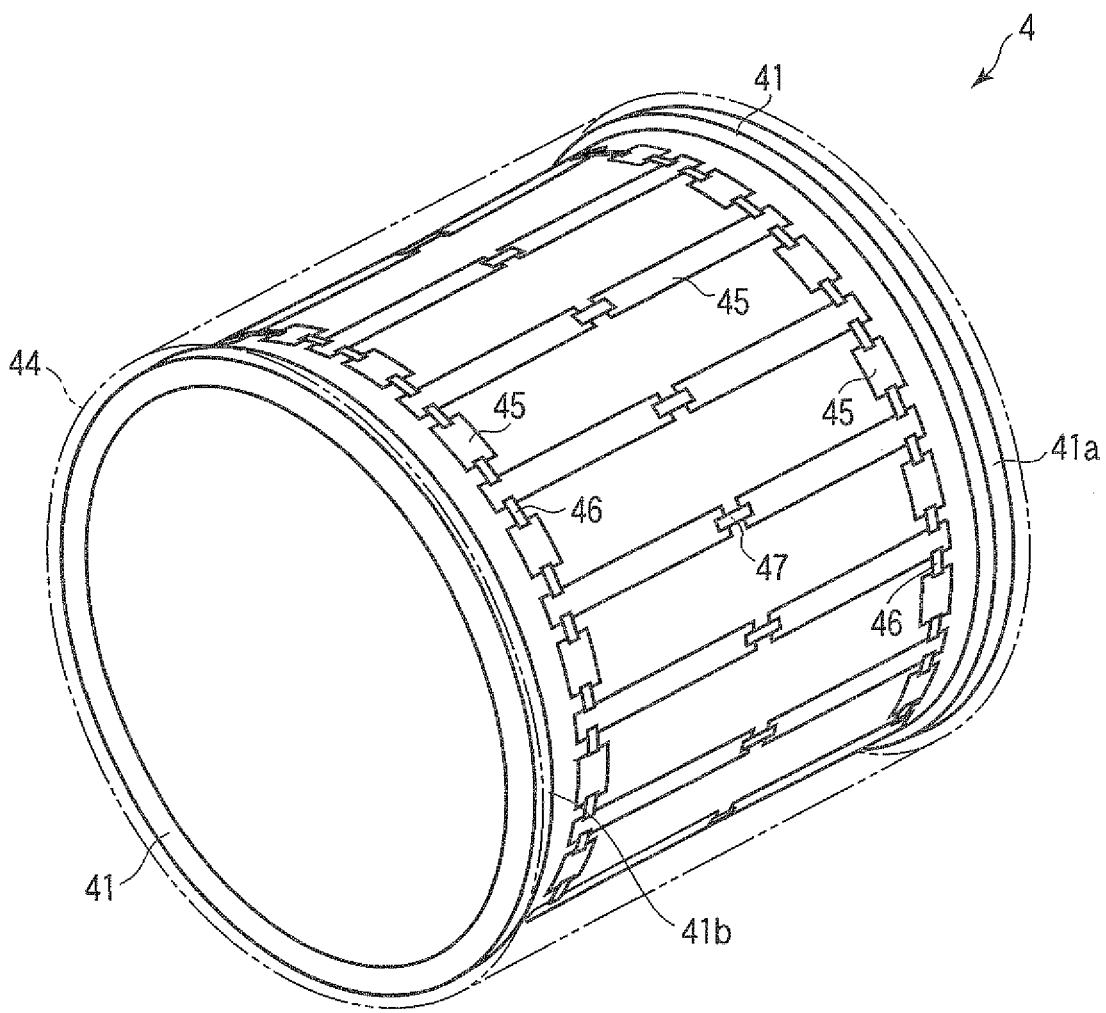
FIG. 3 is a perspective view of a body coil unit structure shown in FIG. 2.

Hereinafter, several embodiments of the present invention will be explained with reference to the drawings.

First Embodiment

FIG. 1 shows a structure of a magnetic resonance diagnostic apparatus 100 according to a first embodiment. As shown in FIG. 1, the magnetic resonance diagnostic apparatus 100 includes a static field magnet unit 1, a gradient coil unit 2, a gradient power supply 9, a body coil 4, a bed 10, a bed controller 11, a transmitter 12, a local coil 13, a receiver 14, and a computer system 15.

The static field magnet unit 1 is formed in the shape of a hollow cylinder and adapted to generate a uniform static magnetic field within its inside space. As the static field magnet unit 1, for example, a permanent magnet, a superconducting magnet, or the like is used.

The gradient coil unit 2 is formed in the shape of a hollow cylinder and placed inside the static field magnet unit 1. The gradient coil unit 2 is a combination of three types of coils respectively corresponding to the three mutually orthogonal X-, Y-, and Z-axes. When the three coils are individually supplied with currents from the gradient power supply 9, the gradient coil unit 2 generates gradient magnetic fields each of which has its strength varied along a corresponding one of the X-, Y-, and Z-axes. Suppose that the Z-axis direction coincides with the direction of the static magnetic field. The gradient magnetic fields along the X-, Y-, and Z-axes directions are used as a slice selecting gradient magnetic field Gs, a phase encoding gradient magnetic field Ge, and a readout gradient magnetic field Gr, respectively. The slice selecting gradient magnetic field Gs is used to arbitrarily determine an imaging plane section. The phase encoding gradient magnetic field Ge is used to change the phase of the magnetic resonance signals according to spatial location. The readout gradient magnetic field Gr is used to change the frequency of the magnetic resonance signals according to spatial location.

Note that the longitudinal dimension of the gradient coil unit 2 is shorter than that of the static field magnet unit 1.

A gantry is formed by covering the static field magnet unit 1 and the gradient coil unit 2 with a gantry housing (not shown). In the gantry housing; a cylindrical opening portion is formed in the gradient coil unit 2, and an imaging space is formed inside the opening portion.

A subject 200 is placed on a top board 10a of the bed 10 and moved into the imaging space. Note that the shape of the imaging space is not limited to a cylindrical shape, and may be another shape such as a polygonal column shape. The top board 10a of the bed 10 is driven by the bed controller 11 to move longitudinally and vertically. Usually, the bed 10 is installed so that its longitudinal axis is parallel to the central axis of the static field magnet unit 1.

The body coil 4 is placed inside the gradient coil unit 2 and generates a radio-frequency magnetic field in response to a radio-frequency pulse from the transmitter 12. The body coil 4 is adapted to receive magnetic resonance signals emitted from the subject 200 due to the influence of the radio-frequency magnetic field. The output signal from the body coil 4 is applied to the receiver 14.

The transmitter 12 transmits radio-frequency pulses corresponding to Larmor frequency to a transmitting RF coil 4.

The local coil 13 is placed inside the gradient coil unit 2 and adapted to receive magnetic resonance signals emitted from the subject 200 due to the influence of the radio-frequency magnetic field. The output signal from the local coil 13 is applied to the receiver 14.

The receiver 14 produces magnetic resonance signal data on the basis of the output signal from the body coil 4 or the output signal from the local coil 13.

Further, the transmitter 12 transmits RF pulses to the body coil unit 4 only during a transmission period. The receiver 14 inputs output signals from the body coil unit 4 only during a reception period, which is different from the transmission period.

The computer system 15 includes an interface unit 15a, a data collection unit 15b, a reconstruction unit 15c, a memory unit 15d, a display unit 15e, an input unit 15f, and a main controller 15g.

The interface unit 15a is connected to the gradient power supply 9, the bed controller 11, the transmitter 12, the local coil 13, the receiver 14, and the like. The interface unit 15a inputs/outputs signals exchanged between the respective units connected to the interface unit 15a and the computer system 15.

The data collection unit 15b collects via the interface unit 15a digital signals output from the receiver 14 and then stores the collected digital signals, i.e., the magnetic resonance signal data, into the memory unit 15d.

The reconstruction unit 15c performs postprocessing, i.e., reconstruction, such as Fourier transforms, on the magnetic resonance signal data stored in the memory unit 15d to obtain spectrum data of desired nuclear spins within the subject 200 or image data.

The memory unit 15d stores magnetic resonance signal data and spectrum data or image data for each patient.

The display unit 15e displays a variety of information, such as spectrum data, image data, and the like, under the control of main controller 15g. As the display unit 15e, there is available a display device, such as a liquid crystal display.

The input unit 15f receives commands and information input from an operator. As the input unit 15f, there is available a pointing device such as a mouse or trackball, a selection device such as a mode changeover switch, or an input device such as a keyboard in accordance with the occasion.

The main controller 15g is equipped with a CPU, a memory, and the like, which are not shown in the block diagram and collectively controls the magnetic resonance diagnostic apparatus 100 of this embodiment. The main controller 15g has a variety of controlling functions to implement the known functions in the magnetic resonance diagnostic apparatus 100.

FIG. 2 is a partially cutaway view of a gantry structure of the magnetic resonance diagnostic apparatus 100 according to the first embodiment. Further, portions identical to those in FIG. 1 are applied symbols identical thereto. Detailed explanations thereof are omitted.

The gantry is provided with a static field magnet unit 1, a gradient coil unit 2, a bore tube 3, a body coil unit 4, a cover 5 and a bed rail 6.

The static field magnet unit 1 is formed in the shape of a hollow cylinder and adapted to generate a uniform static magnetic field within its inside space. As the static field magnet unit 1, for example, a permanent magnet or a superconductive magnet is used.

The gradient coil unit 2 is formed in the shape of a hollow cylinder and is arranged inside the static field magnet unit 1 in a state where its axis approximately coincides with the axis of the static field magnet unit 1. The gradient coil unit 2 is a combination of three types of coils respectively corresponding to mutually orthogonal X-, Y- and Z-axes. When the three types of coils are independently supplied with currents from the gradient power supply 9, the gradient coil unit 2 generates gradient magnetic fields in which magnetic field strengths are gradient along each of X-, Y- and Z-axes. Suppose that the Z-axis direction coincides with the direction of, for example, the static magnetic field. The gradient magnetic fields along each of X-, Y- and Z-axes are corresponded to, for example, a slice selecting gradient magnetic field Gs, a phase encoding gradient magnetic field Ge and a readout gradient magnetic field Gr, respectively. The slice selecting gradient magnetic field Gs is used to arbitrarily determine an imaging cross section. The phase encoding gradient magnetic field Ge is used to encode the phase of magnetic resonance signals according to spatial location. The readout gradient magnetic field Gr is used to encode the frequency of magnetic resonance signals according to spatial location. As the gradient coil unit 2, a so called actively shielded gradient coil (ASGC) can be used.

The bore tube 3 is formed in the shape of a hollow cylinder and arranged inside the gradient coil unit 2 in a state where its axis approximately coincides with the axis of the gradient coil unit 2. The bore tube 3 forms an imaging space for imaging a subject 200 placed therein.

The body coil unit 4 is arranged inside the bore tube 3 and includes an inner cylinder 41, partition members 42 and 43 and an external cylinder 44.

The inner cylinder 41 is in the shape of a hollow cylinder and has on both ends flanges 41a and 41b, which protrude outwardly.

The external cylinder 44 is in the shape of a hollow cylinder. The inner diameter of the external cylinder 44 is approximately equal to the diameter including the ends of flanges 41a and 41b of the inner cylinder 41. The external cylinder 44 accommodates the inner cylinder 41 therein and is fixed at the distal ends of flanges 41a and 41b of the inner cylinder 41. A material which has translucency along with radiant heat insulation capability is used for the external cylinder 44. The external cylinder 44 may be formed cylindrical in advance, or formed cylindrical by winding a sheet-like member around the inner cylinder 41.

In this manner, a circular belt-like space is formed between the inner cylinder 41 and the external cylinder 44, and a radio frequency (RF) coil is mounted on the outer surface of the inner cylinder 41. Here, suppose the RF coil is a bird cage type whole body (WB) coil. In this manner, the WB coil is arranged inside the space formed between the inner cylinder 41 and the external cylinder 44. Further, in FIG. 2, the illustration of the WB coil is omitted.

The partition members 42 and 43 are formed by using, for example, urethane foam, and are approximately ring-like. The inner diameters of the partition members 42 and 43 are approximately the same as the outer diameter of the inner cylinder 41. Their widths are approximately the same as the amount of protrusion of flanges 41a and 41b of the inner cylinder 41. The partition members 42 and 43 are arranged on the outside of the inner cylinder 41. In this manner, the partition members 42 and 43 partition the space formed between the inner cylinder 41 and the external cylinder 44 into three spaces, 44a, 44b and 44c. However, on each exterior portion of the partition members 42 and 43 is formed a notch which forms openings 42a and 43a that communicate space 44a and space 44b, and space 44b and space 44c, respectively. Further, as explained later, air is flowed through spaces 44a, 44b and 44c, in which each of the spaces functions as a duct.

The external cylinder 44 is fixed to the inner cylinder 41 with fixing strength which is capable of securing airtightness between the inner cylinder 41 and external cylinder 44 to an extent that air flowing in spaces 44a, 44b and 44c does not leak easily.

The cover 5 covers the body coil unit 4 so that the subject 200 mounted in the imaging space does not touch the body coil unit 4.

The bed rail 6 is arranged in a state which penetrates through the inside of the body coil unit 4. The bed rail 6 guides the bed top, which is not shown, sent in from the right side of FIG. 2 to a horizontal direction in FIG. 2. In the bed rail 6 is formed an inlet duct and an outlet duct. The inlet duct is communicated through spaces 44a and 44c and has an opening to introduce air from the outside of the gantry. The outlet duct is communicated through the space 44b and is connected to a fan 8 via an extended duct 7.

FIG. 3 is a perspective view showing a structure of the body coil unit 4. In FIG. 3, the illustration of partition members 42 and 43 are omitted.

On the outer surface of the inner cylinder 41 is provided a plurality of conductive patterns 45 and a plurality of circuit elements 46 and 47 which form the body coil. Further, the circuit element 46 is, for example, a condenser. The circuit element 47 is, for example, a pin diode. The plurality of circuit elements 46 are arranged near both side ends of the inner cylinder 41, in a circumferential direction along the inner cylinder 41. The plurality of circuit elements 47 are arranged near the center of the base portion, in a circumferential direction along the inner cylinder 41. Further, the entire body coil which is formed by the conductive pattern 45 and the circuit elements 46 and 47 is positioned in a space formed by the inner cylinder 41 and the external cylinder 44.

In the magnetic resonance diagnostic apparatus 100 of the first embodiment configured in the above manner, when the body coil emits RF pulse upon imaging, the circuit elements 46 and 47 generate heat. When the fan 8 causes negative pressure to the outlet duct in the bed rail 6 via the extended duct 7 at this time, air is introduced to the inlet duct in the bed rail 6 from the opening thereof, and flows in the order of spaces 44a and 44c, space 44b, the outlet duct, the extended duct 7, and the fan 8. This air flowing through spaces 44a, 44b and 44c comes in contact with the circuit elements 46 and 47 and air-cools the circuit elements 46 and 47. Since the inner cylinder 41 and the external cylinder 44 are firmly fixed, high air-tightness can be secured for spaces 44a, 44b and 44c. Therefore, since almost no air leakage occurs through gaps between the inner cylinder 41 and the external cylinder 44, airflow occurs efficiently in spaces 44a, 44b and 44c and cools the circuit elements 46 and 47 efficiently.

Meanwhile, when assembling the magnetic resonance diagnostic apparatus 100, or upon maintenance of the body coil unit 4, the body coil unit 4 is taken in and out with respect to the space inside the bore tube 3, from the opening of the bore tube 3. Since the body coil unit 4 itself forms spaces 44a, 44b and 44c, the airtightness of the spaces 44a, 44b and 44c is not influenced by whether or not the difference between the outer diameter of the body coil unit 4 and the inner diameter of the bore tube 3 is large. Therefore, the body coil unit 4 is able to have its outer diameter made smaller than the inner diameter of the bore tube 3 to facilitate being taken in and out with respect to the space inside the bore tube 3.

The external cylinder 44 is fixed to the inner cylinder 41. However, for sake of maintenance, it is desirable that the external cylinder 44 can be detached easily from the inner cylinder 41. Therefore, when fixing the external cylinder 44 to the inner cylinder 41, it is desirable to use means which can easily unfix the external cylinder 44 from the inner cylinder 41, such as by using a screw cramp. In the case of using a screw cramp, it is fine to arrange a sealing agent using, such as, urethane foam between the inner cylinder 41 and the external cylinder 44. It is also fine to use an adhesive agent which is capable of unfixing the external cylinder 44 from the inner cylinder 41 without causing damage to the inner cylinder 41 while securing the above mentioned fixing strength.

Further, in the first embodiment, the external cylinder 44 is formed by a translucent material. Therefore, a maintenance worker is able to see the body coil without unfixing the external cylinder 44 from the inner cylinder 41.

Further, in the first embodiment, the external cylinder 44 is formed by a material having radiant heat insulation capability. Therefore, it is capable of preventing temperatures from rising in spaces 44a, 44b and 44c and the space inside the inner cylinder 41 caused by radiant heat generated by the gradient coil unit 2.

Second Embodiment

Figure 4:
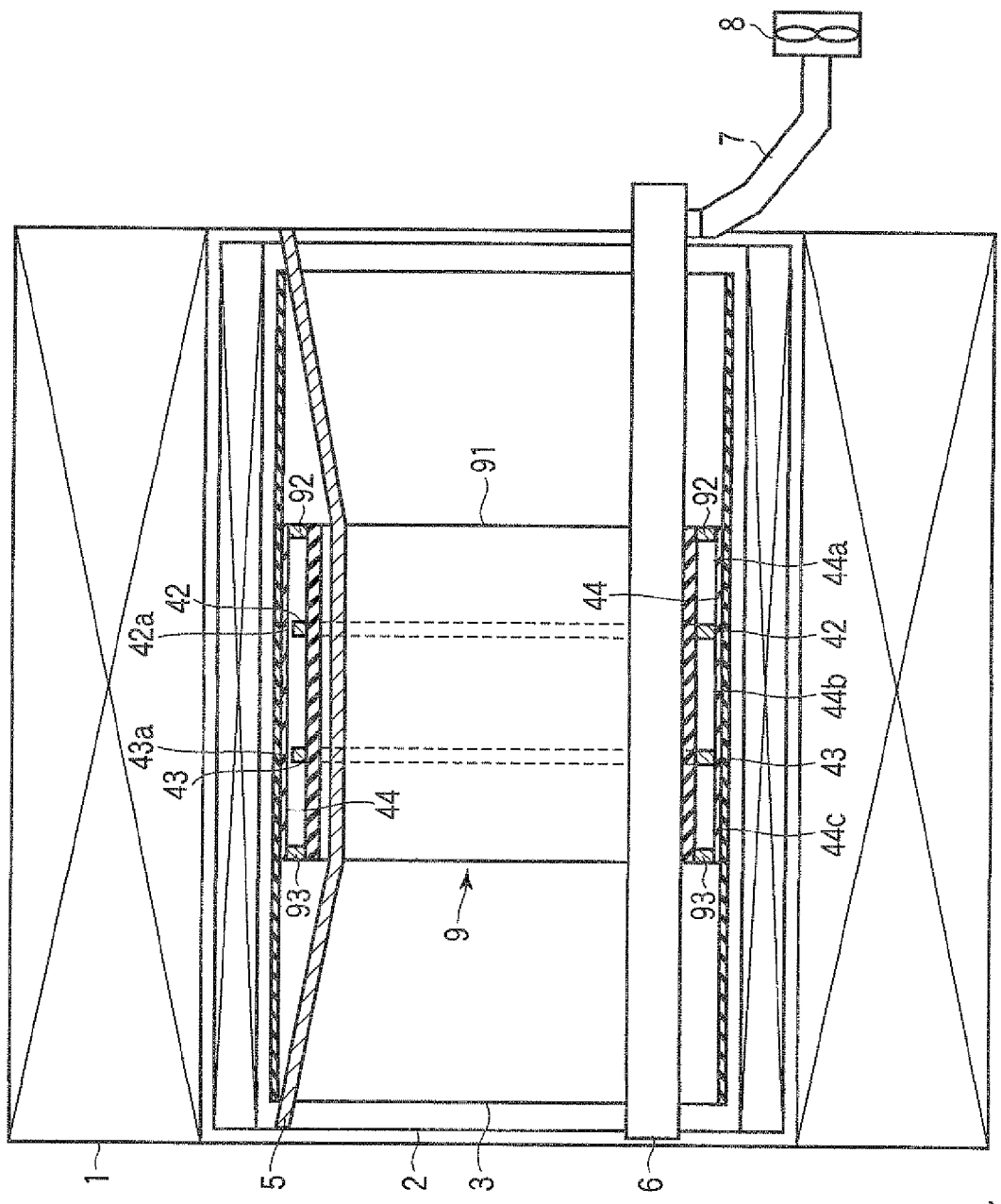
FIG. 4 is a partially cutaway view of a structure of a gantry in a magnetic resonance diagnostic apparatus according to a second embodiment.

FIG. 4 is a partially cutaway view of a structure of a gantry in the magnetic resonance diagnostic apparatus 100 according to a second embodiment. Further, portions identical to those in FIGS. 1 to 3 are applied symbols identical thereto. Detailed explanations thereof are omitted.

This gantry is provided with a static field magnet unit 1, a gradient coil unit 2, a bore tube 3, a cover 5, a bed rail 6 and a body coil unit 9. In other words, the gantry in the second embodiment comprises a body coil unit 9 instead of the body coil unit 4 of the gantry in the first embodiment.

The body coil unit 9 is arranged inside the bore tube 3. The body coil unit 9 includes partition members 42 and 43, an external cylinder 44, inner cylinder 91 and flange forming members 92 and 93. In other words, the body coil unit 9 comprises an inner cylinder 91 instead of the inner cylinder 41 in the body coil unit 4, and, additionally, flange forming members 92 and 93.

The inner cylinder 91 has a configuration in which flanges 41a and 41b are removed from the inner cylinder 41.

The flange forming members 92 and 93 are formed using, for example, urethane foam, and are formed approximately ring-like. The flange forming members 92 and 93 have inner diameters which are approximately equal to the outer diameter of the inner cylinder 91 and widths which are approximately equal to the protruding amount of flanges 41a and 41b of the inner cylinder 41. The flange forming members 92 and 93 are arranged respectively on both ends on the outside of the inner cylinder 91 and are fixed thereto. In this manner, the flange forming members 92 and 93 form flanges protruding outwards from the inner cylinder 91.

The external cylinder 44 is fixed at the distal end of the flange forming members 92 and 93.

In this manner, a circular band-like space is formed between the inner cylinder 91, the flange forming members 92 and 93 and the external cylinder 44, and a radio frequency (RF) coil is mounted on the outer surface of the inner cylinder 91. In this manner the WB coil is arranged inside the space formed between the inner cylinder 91, the flange forming members 92 and 93 and the external cylinder 44. Further, in FIG. 4, the illustration of the WB coil is omitted.

The partition members 42 and 43 are arranged on the outside of the inner cylinder 91.

The flange forming members 92 and 93 are fixed to the inner cylinder 91 and the external cylinder 44 with fixing strength that is capable of securing airtightness between the inner cylinder 91 and external cylinder 44 and the flange forming members 92 and 93 to an extent that air flowing in the spaces 44a, 44b and 44c are not easily leaked.

In this manner, the body coil unit 9 is different from the body coil unit 4 in that the flange is formed by flange forming members 92 and 93 which are bodies different from the inner cylinder 91. However, the overall shape of the body coil unit 9 is equivalent to the body coil unit 4.

Accordingly, the magnetic resonance diagnostic apparatus 100 of the second embodiment can also achieve an advantage similar to that of the first embodiment.

Third Embodiment

FIG. 5 is a partially cutaway view of a structure of a gantry in the magnetic resonance diagnostic apparatus 100 according to a third embodiment. Further, portions identical to those in FIGS. 1 to 3 are applied symbols identical thereto. Detailed explanations thereof are omitted.

This gantry is provided with a static field magnet unit 1, a gradient coil unit 2, a body coil unit 4, a cover 5 and a bed rail 6. In other words, the gantry in the third embodiment has a configuration in which the bore tube 3 is removed from the gantry in the first embodiment. Further, the body coil unit 4 is formed so that its outer diameter is rather smaller than the inner diameter of the gradient coil unit 2, and is arranged inside the gradient coil unit 2.

When assembling the magnetic resonance diagnostic apparatus 100, or upon maintenance of the body coil unit 4, the body coil unit 4 is taken in and out with respect to the space inside the gradient coil unit 2 from the opening of the gradient coil unit 2. Since the body coil unit 4 itself forms spaces 44a, 44b and 44c, the airtightness of the spaces 44a, 44b and 44c is not influenced by whether or not the difference between the outer diameter of the body coil unit 4 and the inner diameter of the gradient coil unit 2 is large. Therefore, the outer diameter of the body coil unit 4 can be made smaller than the inner diameter of the gradient coil unit 2 to facilitate the body coil unit 4 being taken in and out with respect to the space inside the gradient coil unit 2.

The present invention can be implemented by various modified modes as follows.

It is fine to omit the flanges 41a and 41b of the inner cylinder 41 and provide flanges protruding inwards from the external cylinder 44. Alternatively, in addition to the flanges 41a and 41b of the inner cylinder 41, it is also fine to provide flanges protruding inwards from the external cylinder 44.

It is also fine to arrange a plurality of conductive patterns 45 and a plurality of circuit elements 46 and 47 forming a body coil on the inside surface of the external cylinder 44.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A radio frequency coil unit compatible with a magnetic resonance imaging (MRI) system and configured for use in a magnetic field formed by superimposing a gradient field on a static field in a gantry, wherein the gantry comprises:
a static field magnet unit which generates the static field,
a gradient coil unit which generates the gradient field, and
an airflow generating unit which causes a flow of cooling air, the radio frequency coil unit comprising:
a Self-contained cooling airflow chassis which has
  a) a tubiform inner cylinder,
  b) a plurality of flanges arranged apart from each other, each of the plurality of flanges protruding outwards from the inner cylinder while in contact with a whole outer circumference surface of the inner cylinder,
  c) a tubiform external cylinder in which each of the plurality of flanges contacts an inner surface thereof, and
  d) at least one ring like inner partition member disposed around the inner cylinder between said flanges, wherein the Self-contained cooling airflow chassis forms a flow path for the cooling air in a space surrounded by the inner cylinder, the plurality of flanges, the at least one inner partition member, and the external cylinder; and
a radio frequency coil mounted on the inner cylinder or the external cylinder in the space surrounded by the inner cylinder, the plurality of flanges and the external cylinder,
wherein the internal partition member is configured to form an opening between the external cylinder and the internal partition member itself.

2. The radio frequency coil unit according to claim 1, wherein the external cylinder is formed by winding a sheet material around the plurality of flanges.

3. The radio frequency coil unit according to claim 1, wherein the external cylinder has a heat insulating capability against radiation heat generated by the gradient field coil.

4. The radio frequency coil unit according to claim 1, wherein the external cylinder is transmissive to visible light.

5. The radio frequency coil unit according to claim 1, wherein the external cylinder is capable of shielding radio frequency electromagnetic waves.

6. The radio frequency coil unit according to claim 1, wherein an end of a tubiform member is bent to form the inner cylinder and the flange, or the external cylinder and the flange.

7. The radio frequency coil unit according to claim 1, wherein the gantry further comprises:
a bore tube which forms an inner space inside the static field magnet unit and the gradient coil unit for insertion of a bed table-top and a subject mounted on the bed table-top, and
the radio frequency coil unit is configured to be fitted in the inner space formed by the bore tube, an outer diameter of the external cylinder being smaller than an inner diameter of the bore tube.

8. A magnetic resonance diagnostic apparatus comprising:
a gantry including:
  a static field magnet unit which generates a static field, and
  a gradient coil unit which generates a gradient field to be superimposed on the static field;
an airflow generating means which causes flow of cooling air; and
a radio frequency coil unit including:
  a self-contained cooling airflow chassis which has
    a) a tubiform inner cylinder,
    b) a plurality of flanges arranged apart from each other and protruding outwards from the inner cylinder while in contact with a whole outer circumference surface of the inner cylinder,
    c) a tubiform external cylinder in which each of the plurality of flanges contacts the inner surface thereof, and
    d) at least one ring-like internal partition member disposed around the inner cylinder between said flanges, wherein the self-contained cooling airflow chassis forms a flow path for the cooling air in the space surrounded by the inner cylinder, the plurality of flanges, the partition member, and the external cylinder,
  a radio frequency coil mounted on the inner cylinder or the external cylinder in a space surrounded by the inner cylinder, the plurality of flanges, and the external cylinder,
  wherein the internal partition member is configured to form an opening between the external cylinder and the internal partition member.

9. The magnetic resonance diagnostic apparatus according to claim 8, wherein the external cylinder is formed by winding a sheet material around the plurality of flanges.

10. The magnetic resonance diagnostic apparatus according to claim 8, wherein the external cylinder has a heat insulating capability against radiation heat generated by the gradient field coil.

11. The magnetic resonance diagnostic apparatus according to claim 8, wherein the external cylinder is transmissive to visible light.

12. The magnetic resonance diagnostic apparatus according to claim 8, wherein the external cylinder is capable of shielding radio frequency electromagnetic waves.

13. The magnetic resonance diagnostic apparatus according to claim 8, wherein an end of a tubiform member is bent to form the inner cylinder and the flange, or the external cylinder and the flange.

14. The magnetic resonance diagnostic apparatus according to claim 8, wherein
the gantry further comprises a bore tube which forms an inner space inside the static field magnet unit and the gradient coil unit for insertion of a bed table-top and a subject mounted on the bed table-top, and
the external cylinder is configured to be fitted in the inner space formed by the bore tube, an outer diameter of the external cylinder being smaller than an inner diameter of the bore tube.

15. A radio frequency coil unit configured for use in a magnetic resonance imaging (MRI) gantry having a gradient magnetic field generator disposed within a static magnetic field generator, said radio frequency coil unit comprising:

a cylindrical self-contained cooling airflow chassis configured for removable disposition within said gradient magnetic field generator and defining a toroidal space that is closed except for external cooling air entry and exit ports;
said cylindrical self-contained cooling airflow chassis having at least one internal partition member dividing said cylindrical space into plural internal toroidal air cooling passageways interconnected with each other by an open internal air passage port through said at least one partition member;
conductors, and
interconnected electrical components defining a radio frequency coil disposed within said toroidal space and disposed for cooling by air flowing through said plural internal toroidal passageways and said open internal air passage port through said at least one internal partition.

* * * * *